United States Patent
Rahman et al.

(10) Patent No.: US 11,205,723 B2
(45) Date of Patent: Dec. 21, 2021

(54) SELECTIVE SOURCE/DRAIN RECESS FOR IMPROVED PERFORMANCE, ISOLATION, AND SCALING

(71) Applicant: International Business Machines Corporation, Armonk, NY (US)

(72) Inventors: Ardasheir Rahman, Schenectady, NY (US); Brent Anderson, Jericho, VT (US); Junli Wang, Slingerlands, NY (US); Stuart Sieg, Albany, NY (US); Christopher J. Waskiewicz, Rexford, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 226 days.

(21) Appl. No.: 16/454,561

(22) Filed: Jun. 27, 2019

(65) Prior Publication Data

US 2020/0411682 A1    Dec. 31, 2020

(51) Int. Cl.
| | |
|---|---|
| H01L 29/06 | (2006.01) |
| H01L 27/11 | (2006.01) |
| H01L 29/78 | (2006.01) |
| H01L 29/66 | (2006.01) |
| H01L 21/8234 | (2006.01) |

(52) U.S. Cl.
CPC .... H01L 29/785 (2013.01); H01L 21/823418 (2013.01); H01L 21/823431 (2013.01); H01L 29/66568 (2013.01); H01L 29/66795 (2013.01)

(58) Field of Classification Search
None
See application file for complete search history.

(56) References Cited

U.S. PATENT DOCUMENTS

| | | |
|---|---|---|
| 7,224,033 B2 | 5/2007 | Zhu et al. |
| 9,472,447 B1 | 10/2016 | Kanakasabapathy et al. |
| 9,570,357 B2 | 2/2017 | Anderson et al. |
| 9,761,712 B1 | 9/2017 | Anderson et al. |
| 9,824,921 B1 | 11/2017 | Labonte et al. |
| 9,929,236 B1 | 3/2018 | Paul et al. |
| 2002/0086497 A1 | 7/2002 | Kwok |
| 2006/0175669 A1 | 8/2006 | Kim et al. |
| 2018/0211947 A1 | 7/2018 | Chu et al. |

OTHER PUBLICATIONS

M. Carmona, et al. "Study of gate contact over active area," 2014 IEEE: 978-1-4799-4696; 4 pages total.

*Primary Examiner* — Joseph C. Nicely
*Assistant Examiner* — Lamont B Koo
(74) *Attorney, Agent, or Firm* — Cantor Colburn LLP; Erik Johnson

(57) ABSTRACT

Embodiments of the present invention are directed to a method for increasing the available width of a shallow trench isolation region. In a non-limiting embodiment of the invention, a semiconductor fin is formed over a substrate. A source or drain is formed on a surface of the substrate between the semiconductor fin and the substrate. A liner is formed over a surface of the semiconductor fin and a surface of the substrate is recessed to expose a sidewall of the source or drain. A mask is formed over the semiconductor fin and the liner. The mask is patterned to expose a top surface and a sidewall of the liner. A sidewall of the source or drain is recessed and a shallow trench isolation region is formed on the recessed top surface of the substrate. The shallow trench isolation region is adjacent to the recessed sidewall of the source or drain.

16 Claims, 7 Drawing Sheets

SELECTIVE SOURCE/DRAIN RECESS FOR IMPROVED PERFORMANCE, ISOLATION, AND SCALING

BACKGROUND

The present invention generally relates to fabrication methods and resulting structures for semiconductor devices, and more specifically, to a selective source/drain recess for improved performance, isolation, and future scaling.

Traditional metal oxide semiconductor field effect transistor (MOSFET) fabrication techniques include process flows for constructing planar field effect transistors (FETs). A planar FET includes a substrate (also referred to as a silicon slab), a gate formed over the substrate, source and drain regions formed on opposite ends of the gate, and a channel region near the surface of the substrate under the gate. The channel region electrically connects the source region to the drain region while the gate controls the current in the channel. The gate voltage controls whether the path from drain to source is an open circuit ("off") or a resistive path ("on").

In recent years, research has been devoted to the development of nonplanar transistor architectures. For example, vertical tunneling FETs (VFETs) employ semiconductor fins and side-gates can be contacted outside the active region, resulting in increased device density and some increased performance over lateral devices. In contrast to planar FETs, the source to drain current in a VFET flows through the vertical fin in a direction that is perpendicular with respect to a horizontal major surface of the wafer or substrate. A VFET can achieve a smaller device footprint because its channel length is decoupled from the contacted gate pitch.

SUMMARY

Embodiments of the invention are directed to a method for increasing the available width of a shallow trench isolation region. A non-limiting example of the method includes forming a semiconductor fin over a substrate. A source or drain is formed on a surface of the substrate between the semiconductor fin and the substrate. A liner is formed over a surface of the semiconductor fin and a surface of the substrate is recessed to expose a sidewall of the source or drain. A mask is formed over the semiconductor fin and the liner. The mask is patterned to expose a top surface and a sidewall of the liner. A sidewall of the source or drain is recessed and a shallow trench isolation region is formed on the recessed top surface of the substrate. The shallow trench isolation region is adjacent to the recessed sidewall of the source or drain.

Embodiments of the invention are directed to a method for increasing the available width of a shallow trench isolation region. A non-limiting example of the method includes forming a pair of semiconductor fins over a substrate. A liner is formed over a surface of the semiconductor fins and a top surface of the substrate between the semiconductor fins is recessed. A mask is formed over the semiconductor fins and the liner. The mask can be patterned to expose a top surface and a sidewall of the liner. A sidewall of the substrate can be recessed and a shallow trench isolation region can be formed on the recessed surface of the substrate.

Embodiments of the invention are directed to a semiconductor structure. A non-limiting example of the semiconductor device includes a semiconductor fin over a surface of a substrate and a source or drain on a surface of the substrate. The source or drain is between the semiconductor fin and the substrate. The semiconductor device further includes a shallow trench isolation region on a recessed surface of the substrate. The shallow trench isolation regain is enlarged. A sidewall of the shallow trench isolation region is coplanar to a sidewall of the semiconductor fin.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
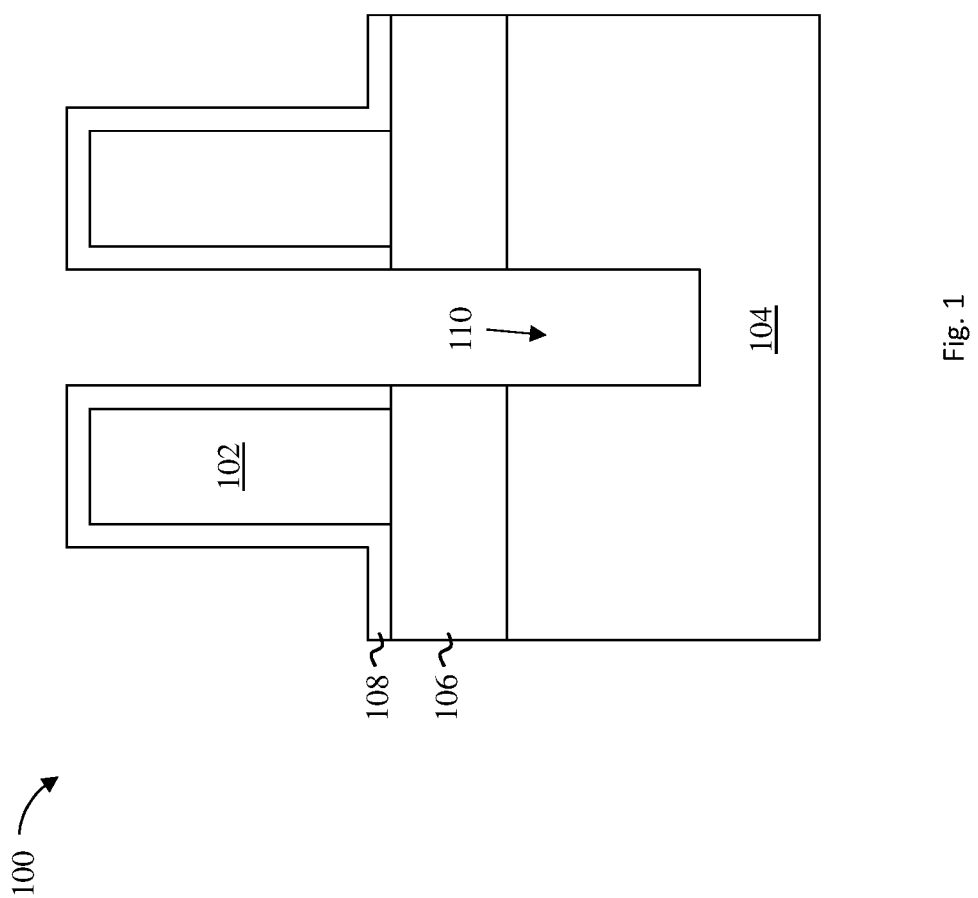
FIG. 1 depicts a cross-sectional view of a semiconductor structure after a processing operation according to one or more embodiments of the invention.

The diagrams depicted herein are illustrative. There can be many variations to the diagram or the operations described therein without departing from the spirit of the invention. For instance, the actions can be performed in a differing order or actions can be added, deleted or modified.

In the accompanying figures and following detailed description of the described embodiments of the invention, the various elements illustrated in the figures are provided with two or three-digit reference numbers. With minor exceptions, the leftmost digit(s) of each reference number correspond to the figure in which its element is first illustrated.

DETAILED DESCRIPTION

It is understood in advance that although example embodiments of the invention are described in connection with a particular transistor architecture, embodiments of the invention are not limited to the particular transistor architectures or materials described in this specification. Rather, embodiments of the present invention are capable of being implemented in conjunction with any other type of transistor architecture or materials now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, continued scaling of VFET devices requires improvements in parasitic capacitance (e.g., $V_{dd}$ to $V_{ss}$ capacitance) as well as improvements in isolation scaling (e.g., N to N, P to P, and N to P isolation). While various approaches to reducing parasitic capacitance in the VFET process flow have been explored to varying degrees of success, conventional approaches do not address the relatively large isolation area required between the active regions of the substrate. Addressing this area is difficult, as conventional VFET process flows can leave a 2-15 nm bottom source/drain ledge beyond the semiconductor fin sidewall. This ledge is present because of a sacrificial oxide protective cap that is formed over the fins prior to the shallow trench isolation (STI) RIE. While this protective cap is needed to prevent fin loss during the STI RIE, the protective cap also prevents a full recess of the bottom source/drain. The bottom source/drain ledge represents an isolation area penalty and reduces the available shallow trench isolation size at a same process node. In other words, the maximum available width for the shallow trench isolation region is constrained in part by the presence of this ledge.

Turning now to an overview of aspects of the present invention, one or more embodiments of the invention address the above-described shortcomings of the prior art by providing a new semiconductor structure and a method for shrinking the bottom source/drain after STI formation, thereby increasing the available width for the STI. The method can include forming a mask over a semiconductor fin. The mask can be patterned to expose a top surface and a sidewall of a protective liner (e.g., a sacrificial oxide) formed over the fin. Sidewalls of the bottom source/drain and substrate can be recessed selective to the mask to widen the available area of a shallow trench isolation region. Advantageously, increasing the STI width improves N to N, P to P, and N to P isolation, reduces overall parasitic capacitance, simplifies downstream overlays (provides a larger area/process margins), and reduces leakage currents.

Turning now to a more detailed description of aspects of the present invention, FIG. 1 depicts a cross-sectional view of a semiconductor structure 100 after an initial set of fabrication operations have been applied as part of a method of fabricating a final semiconductor device according to one or more embodiments of the invention. In embodiments of the invention, the final semiconductor device can be a variety of types of MOSFETs, including, for example, non-planar n-type field effect transistors (NFET) and p-type field effect transistors (PFET). For example, the final semiconductor device can be an n-type VFET or a p-type VFET. In the embodiment shown in FIG. 1, the semiconductor structure 100 includes one or more fins 102 formed over a substrate 104.

The fins 102 can be formed on the substrate 104 using known front-end-of-line (FEOL) VFET fabrication techniques. The substrate 104 and the fins 102 can be made of any suitable semiconductor material, such as, for example, monocrystalline Si, silicon germanium (SiGe), III-V compound semiconductor, II-VI compound semiconductor, or semiconductor-on-insulator (SOI). Group III-V compound semiconductors, for example, include materials having at least one group III element and at least one group V element, such as one or more of aluminum gallium arsenide (AlGaAs), aluminum gallium nitride (AlGaN), aluminum arsenide (AlAs), aluminum indium arsenide (AlIAs), aluminum nitride (AlN), gallium antimonide (GaSb), gallium aluminum antimonide (GaAlSb), gallium arsenide (GaAs), gallium arsenide antimonide (GaAsSb), gallium nitride (GaN), indium antimonide (InSb), indium arsenide (InAs), indium gallium arsenide (InGaAs), indium gallium arsenide phosphide (InGaAsP), indium gallium nitride (InGaN), indium nitride (InN), indium phosphide (InP) and alloy combinations including at least one of the foregoing materials. The alloy combinations can include binary (two elements, e.g., gallium (III) arsenide (GaAs)), ternary (three elements, e.g., InGaAs) and quaternary (four elements, e.g., aluminum gallium indium phosphide (AlInGaP)) alloys.

In some embodiments of the invention, the substrate 104 and the fins 102 can be made of a same semiconductor material. In other embodiments of the invention, the substrate 104 can be made of a first semiconductor material, and the fins 102 can be made of a second semiconductor material. In some embodiments of the invention, the substrate 104 and the fins 102 can be made of silicon or SiGe. In some embodiments of the invention, the substrate 104 is a silicon substrate and the fins 102 are silicon germanium fins having a germanium concentration of about 10 to about 80 percent. The fins 102 can each have a height ranging from 4 nm to 150 nm. In some embodiments of the present invention, the fins 102 are formed to a height of about 60 nm, although other fin heights are within the contemplated scope of the invention.

In some embodiments of the invention, the substrate 104 can include a buried oxide layer (not depicted). The buried oxide layer can be made of any suitable dielectric material, such as, for example, a silicon oxide. In some embodiments of the invention, the buried oxide layer is formed to a thickness of about 145 nm, although other thicknesses are within the contemplated scope of the invention.

As shown in FIG. 1, in some embodiments of the invention, source and drain regions 106 are formed over the substrate 104, and the fins 102 are formed over the source and drain regions 106. In some embodiments of the invention, the source and drain regions 106 are epitaxially grown on exposed surfaces of the substrate 104. In some embodiments of the invention, the source and drain regions 106 are formed to a thickness of about 10 nm to about 60 nm, for example 30 nm, although other thicknesses are within the contemplated scope of the invention.

The source and drain regions 106 can be epitaxially grown using, for example, vapor-phase epitaxy (VPE), molecular beam epitaxy (MBE), liquid-phase epitaxy (LPE), or other suitable processes. The source and drain regions 106 can be semiconductor materials epitaxially grown from gaseous or liquid precursors.

In some embodiments of the invention, the gas source for the epitaxial deposition of semiconductor material includes a silicon containing gas source, a germanium containing gas source, or a combination thereof. For example, a Si layer can be epitaxially deposited (or grown) from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. A germanium layer can be epitaxially deposited from a germanium gas source that is selected from the group consisting of germane, digermane, halogermane, dichlorogermane, trichlorogermane, tetrachlorogermane and combinations thereof. A silicon germanium alloy layer can be epitaxially formed utilizing a combination of such gas sources. Carrier gases like hydrogen, nitrogen, helium and argon can be used. In some embodiments of the invention, the epitaxial semiconductor materials include carbon doped silicon (Si:C). This Si:C layer can be grown in the same chamber used for other epitaxy steps or in a dedicated Si:C epitaxy chamber. The Si:C can include carbon in the range of about 0.2 percent to about 3.0 percent.

Epitaxially grown silicon and silicon germanium can be doped by adding n-type dopants (e.g., P or As) or p-type dopants (e.g., Ga, B, $BF_2$, or Al). In some embodiments of the invention, the source and drain regions 106 can be epitaxially formed and doped by a variety of methods, such as, for example, in-situ doped epitaxy (doped during deposition), doped following the epitaxy, or by implantation and plasma doping. The dopant concentration in the doped regions can range from $1 \times 10^{19}$ $cm^{-3}$ to $2 \times 10^{21}$ $cm^{-3}$, or between $1 \times 10^{20}$ $cm^{-3}$ and $1 \times 10^{21}$ $cm^{-3}$.

In some embodiments of the invention, the source and drain regions 106 are made of silicon germanium. In some embodiments of the invention, the source and drain regions 106 are made of silicon germanium having a germanium concentration of about 10 to about 65 percent, for example, 50 percent, although other germanium concentrations are within the contemplated scope of the invention.

In some embodiments of the invention, a liner 108 is formed over the source and drain regions 106 and the fins 102. In some embodiments of the invention, the liner 108 is a protective liner deposited over the fins 102 prior to forming a shallow trench isolation region. The liner 108 can protect the fins 102 from etch back during the subsequent STI RIE. The liner 108 can be formed using any suitable material capable of providing etch selectivity during the STI RIE. In some embodiments of the invention, the liner 108 can include, for example, a low-k dielectric, silicon nitride, silicon oxide, SiON, SiC, SiOCN, or SiBCN. A low-k dielectric can include a dielectric material having a dielectric constant less than the dielectric constant of silicon dioxide (e.g., less than about 3.9). In some embodiments of the invention, the liner 108 is a silicon oxide liner.

In some embodiments of the invention, the liner 108 is conformally deposited over a surface of the source and drain regions 106 and the fins 102. In some embodiments of the invention, the liner 108 is formed using a chemical vapor deposition (CVD), plasma-enhanced CVD (PECVD), ultra-high vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), atomic layer deposition (ALD), flowable CVD, spin-on dielectrics, physical vapor deposition (PVD), molecular beam epitaxy (MBE), chemical solution deposition, or other like process. In some embodiments of the invention, the liner 108 can be formed to a nominal (conformal) thickness of about 10 nm or less, or 5 nm or less, although other thicknesses are within the contemplated scope of the invention.

As further depicted in FIG. 1, a portion of the substrate 104 can be recessed to form a trench 110. The trench 110 can be formed using, for example, a wet etch, a dry etch, or a combination of wet and/or dry etches. In some embodiments of the invention, the trench 110 is patterned using a RIE. In some embodiments of the invention, portions of the source and drain regions 106 are removed prior to or while recessing the substrate 104.

Figure 2:
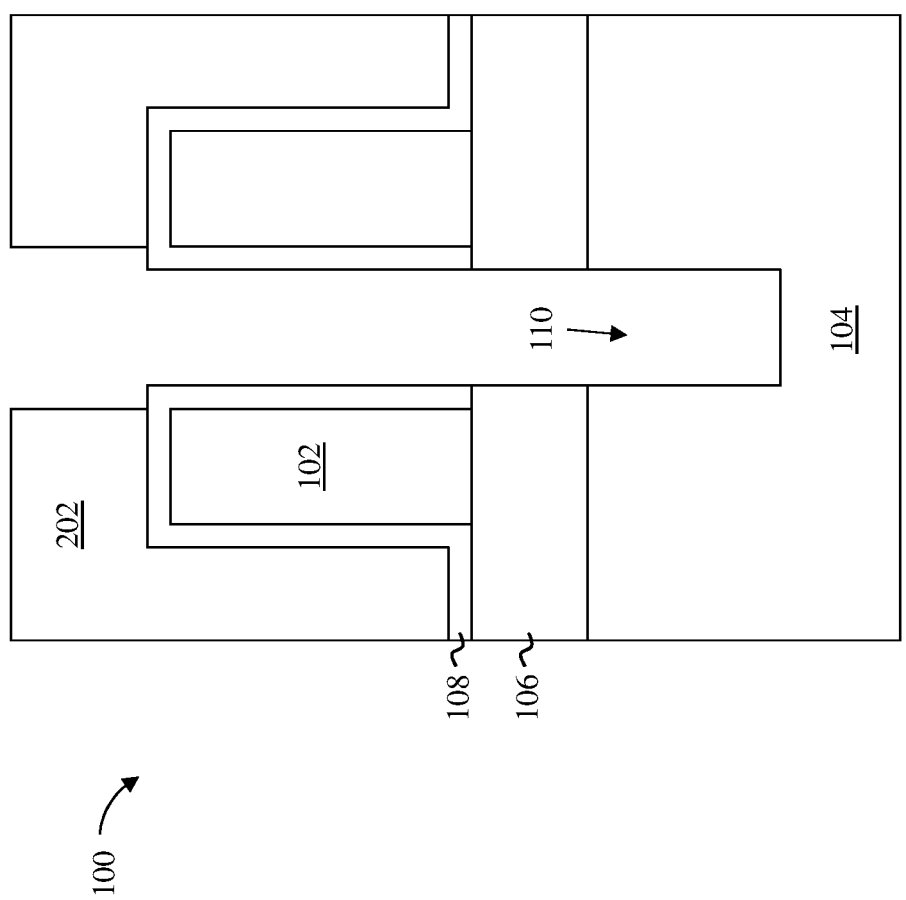
FIG. 2 depicts a cross-sectional view of a semiconductor structure after a processing operation according to one or more embodiments of the invention.

FIG. 2 depicts a cross-sectional view of the semiconductor structure 100 after a processing operation according to one or more embodiments of the invention. As illustrated in FIG. 2, a mask 202 can be formed over the semiconductor structure 100. In some embodiments of the invention, the mask 202 is patterned to expose a top surface and a sidewall of the liner 108.

The mask 202 can be formed over a surface of the liner 108 using any suitable process. In some embodiments of the invention, the mask 202 can be formed using, for example, CVD, PECVD, ALD, flowable CVD, spin-on dielectrics, or PVD. The mask 202 can be made of any suitable dielectric material, such as, for example, a low-k dielectric, a nitride, silicon nitride, silicon oxide, SiON, SiC, SiOCN, or SiBCN.

In some embodiments of the invention, the mask 202 includes a patterning film stack. In some embodiments of the invention, the film stack is a bi-layer stack, a tri-layer stack, or a multilayer stack having a topmost photoresist layer. In some embodiments of the invention, the film stack is a tri-layer stack (not depicted) having an organic planarization layer (OPL), an antireflective coating, and a photoresist. Patterning film stacks typically include OPLs because high resolution photoresists themselves often do not provide enough etch resistance for pattern transfer. OPLs are used as etch masks for pattern transfers into inorganic substrates, to fill pre-existing features, and to planarize the substrate to allow for larger patterning process windows.

In some embodiments of the invention, the OPL can include a photo-sensitive organic polymer having a light-sensitive material that, when exposed to electromagnetic (EM) radiation, is chemically altered and thus configured to be removed using a developing solvent. For example, the photo-sensitive organic polymer can be polyacrylate resin, epoxy resin, phenol resin, polyamide resin, polyimide resin, unsaturated polyester resin, polyphenylenether resin, polyphenylenesulfide resin, or benzocyclobutene (BCB). More generally, for example, the OPL can include any organic polymer and a photo-active compound having a molecular structure that can attach to the molecular structure of the organic polymer. In some embodiments of the invention, the OPL material is selected to be compatible with an overlying antireflective coating, the overlying photoresist, and the lithographic wavelength employed (i.e., ArF, KrF, etc.). In some embodiments, the OPL can be applied using, for example, spin coating technology.

The antireflective coating can be made of any suitable antireflective material, such as, for example, a low temperature oxide (LTO), SiARC, TiARC, or SiON. In some embodiments of the invention, the antireflective coating is SiARC. The antireflective coating can be deposited using, for example, a spin-on process. In some embodiments of the invention, the antireflective coating is deposited to a thickness of about 0.5 to about 5 nm, although other thicknesses are within the contemplated scope of the invention.

The photoresist can include any suitable photoresist material, such as, for example, 248 nm resists, 193 nm resists, 157 nm resists, or EUV (extreme ultraviolet) resists. In some embodiments of the invention, the photoresist can be made of a light sensitive polymer, and can be deposited using any suitable resist process, such as spin-on coating.

Figure 3:
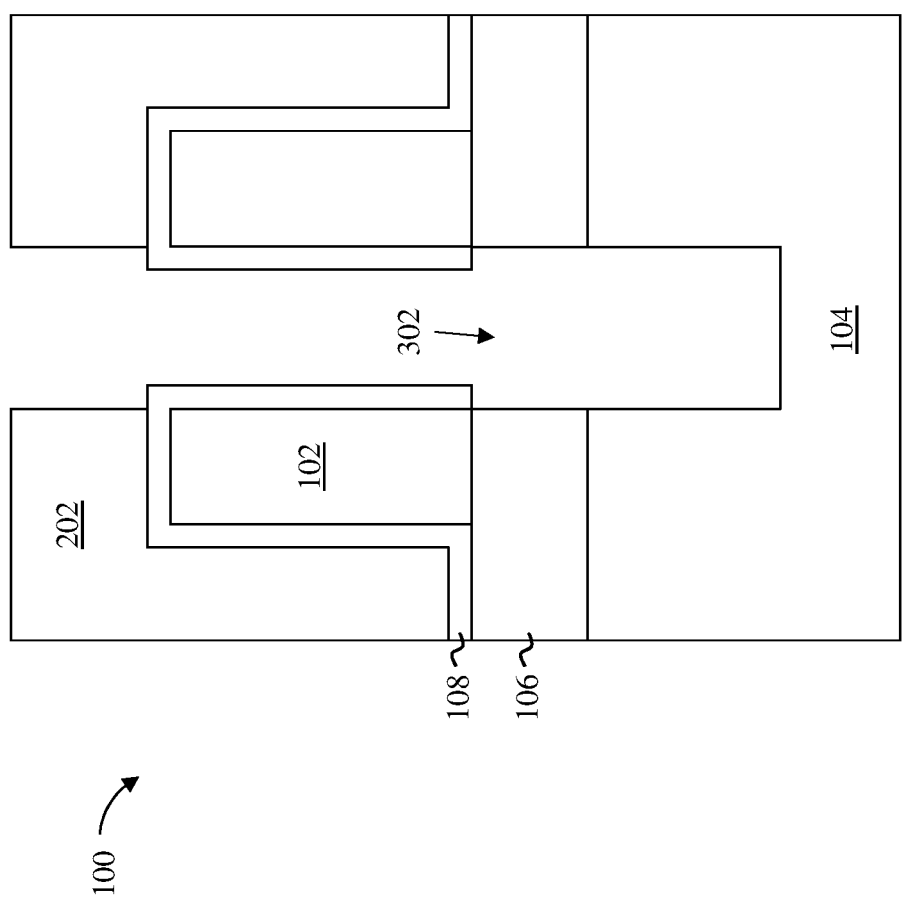
FIG. 3 depicts a cross-sectional view of a semiconductor structure after a processing operation according to one or more embodiments of the invention.

FIG. 3 depicts a cross-sectional view of the semiconductor structure 100 after a processing operation according to one or more embodiments of the invention. As illustrated in FIG. 3, exposed sidewalls of the source and drain regions 106 and the substrate 104 can be recessed to form an extended trench 302. The extended trench 302 can be formed using, for example, a wet etch, a dry etch, or a combination of wet and/or dry etches.

In some embodiments of the invention, the extended trench 302 is formed by exposing sidewalls of the source and drain regions 106 and the substrate 104 to a wet etchant. In some embodiments of the invention, the wet etchant removes portions of the source and drain regions 106 and the substrate 104 selective to the liner 108 and/or the mask 202. In some embodiments of the invention, the source and drain regions 106 are recessed using a timed wet etch. In some embodiments of the invention, the timing of the wet etch is tuned such that sidewalls of the source and drain regions 106 are coplanar (or substantially coplanar, for example, to within 0 to 5 nm of the sidewalls of the fins 102). In other words, the source and drain regions 106 can be aligned to the sidewall of the semiconductor fin within a range of about −5 nm to 5 nm, with 0 nm defining an exact alignment to the sidewall of the semiconductor fin.

In some embodiments of the invention, the wet etchant recesses the source and drain regions 106 and the substrate 104 at a substantially same rate (i.e., recessed sidewalls of the source and drain regions 106 and the substrate 104 will be coplanar or substantially coplanar with 1 to 5 nm). In some embodiments of the invention, the wet etchant recesses the source and drain regions 106 and the substrate 104 at different rates (e.g., the substrate 104 can be etched faster, or slower, depending on the etchant). In other words, recessed sidewalls of the source and drain regions 106 and the substrate 104 will be not be coplanar.

Figure 4:
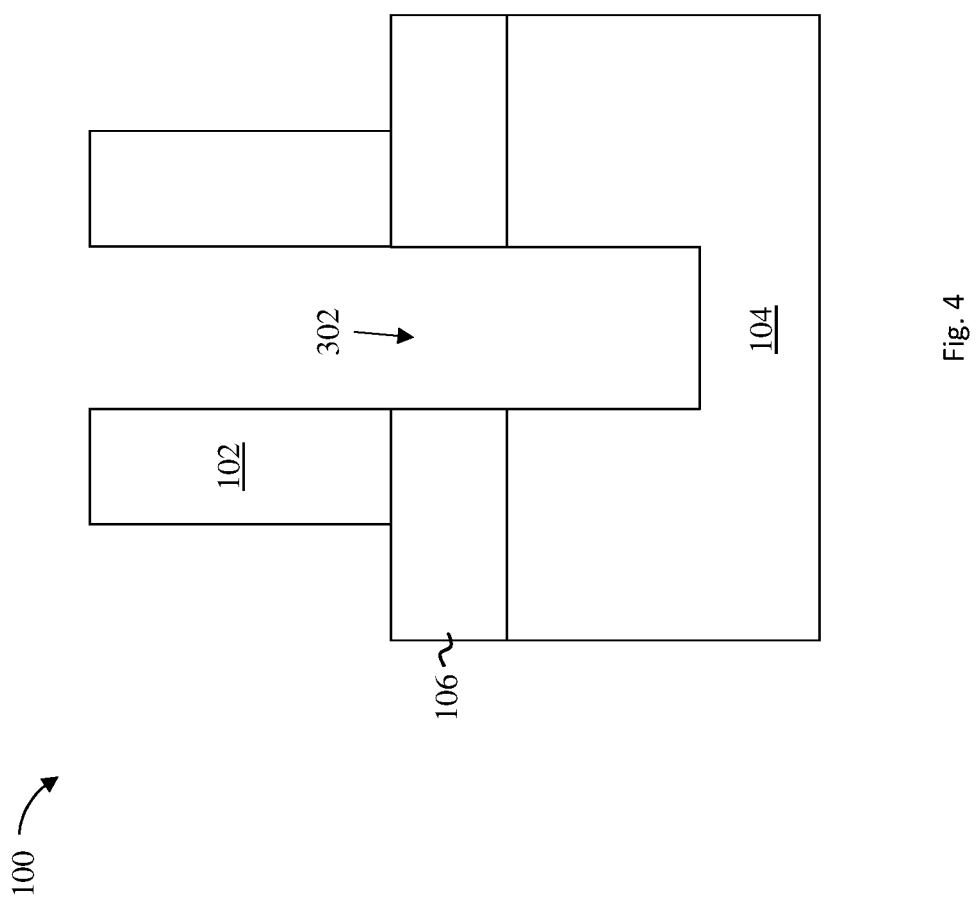
FIG. 4 depicts a cross-sectional view of a semiconductor structure after a processing operation according to one or more embodiments of the invention.

FIG. 4 depicts a cross-sectional view of the semiconductor structure 100 after a processing operation according to one or more embodiments of the invention. As illustrated in FIG. 4, the liner 108 and the mask 202 can be removed to expose a top surface and sidewalls of the fins 102. The liner 108 and the mask 202 can be removed using, for example, a wet etch, a dry etch, or a combination of wet and/or dry etches. In some embodiments of the invention, the mask 202 is removed using an ashing process or a resist stripping process.

Figure 5:
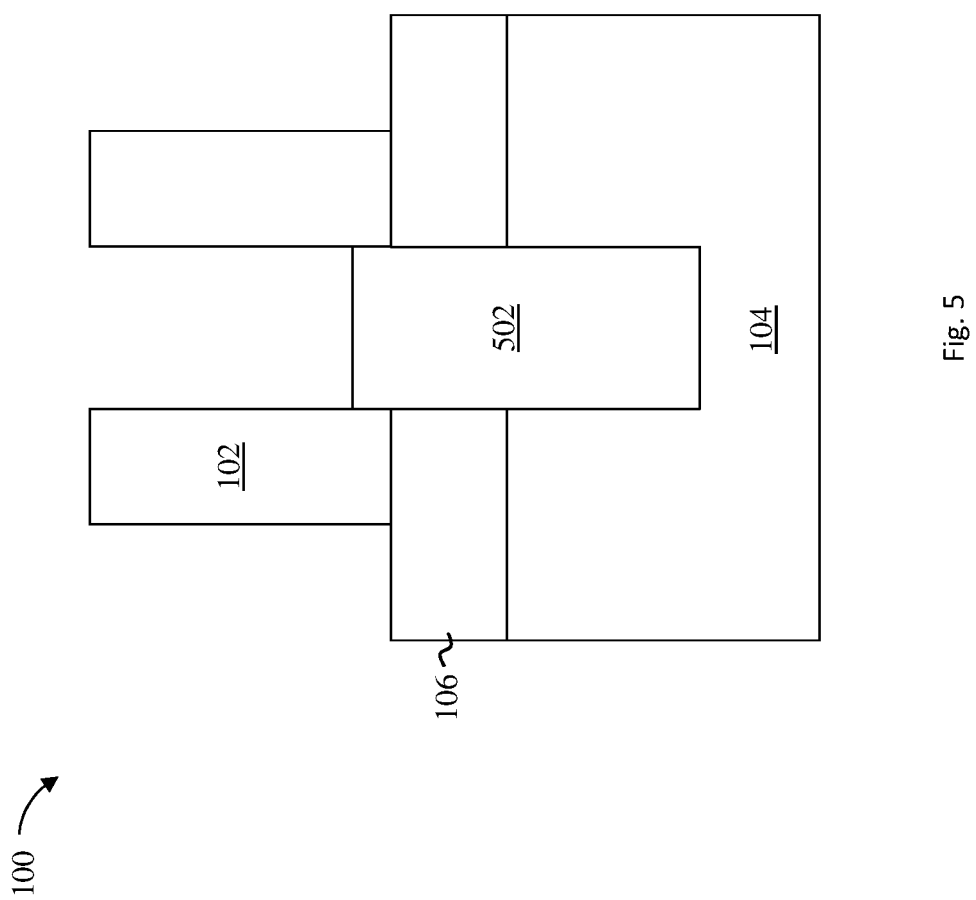
FIG. 5 depicts a cross-sectional view of a semiconductor structure after a processing operation according to one or more embodiments of the invention.

FIG. 5 depicts a cross-sectional view of the semiconductor structure 100 after a processing operation according to one or more embodiments of the invention. As illustrated in FIG. 5, a shallow trench isolation region 502 can be formed by filling the extended trench 302 with dielectric material, such as, a low-k dielectric, a nitride, silicon nitride, silicon oxide, SiON, SiC, SiOCN, or SiBCN. As discussed previously herein, by increasing the width of the extended trench 302, the size of the shallow trench isolation region 502 can be enlarged, lowering the parasitic capacitance of the final device. As further shown in FIG. 5, a sidewall of the shallow trench isolation region 502 can be coplanar to sidewalls of the substrate 104, sidewalls of the source and drain regions 106, and sidewalls of the fins 102. In some embodiments of the invention, a topmost surface of the shallow trench isolation region 502 is formed above a topmost surface of the source and drain regions 106, to provide electrical isolation between adjacent devices.

Once the liner 108 and the mask 202 are removed, and the shallow trench isolation region 502 is formed, the semiconductor structure 100 can be completed using known VFET processes. In some embodiments of the invention, a gate (not shown) is formed over a channel region of the fins 102. The gate can be a high-k metal gate (HKMG) formed over a channel region of the fins 102 using, for example, known replacement metal gate (RMG) processes, or so-called gate-first processes. In some embodiments of the invention, an interlayer dielectric is formed over the semiconductor structure 100 and gate and source/drain contacts (not shown) are formed in the interlayer dielectric.

Figure 6:
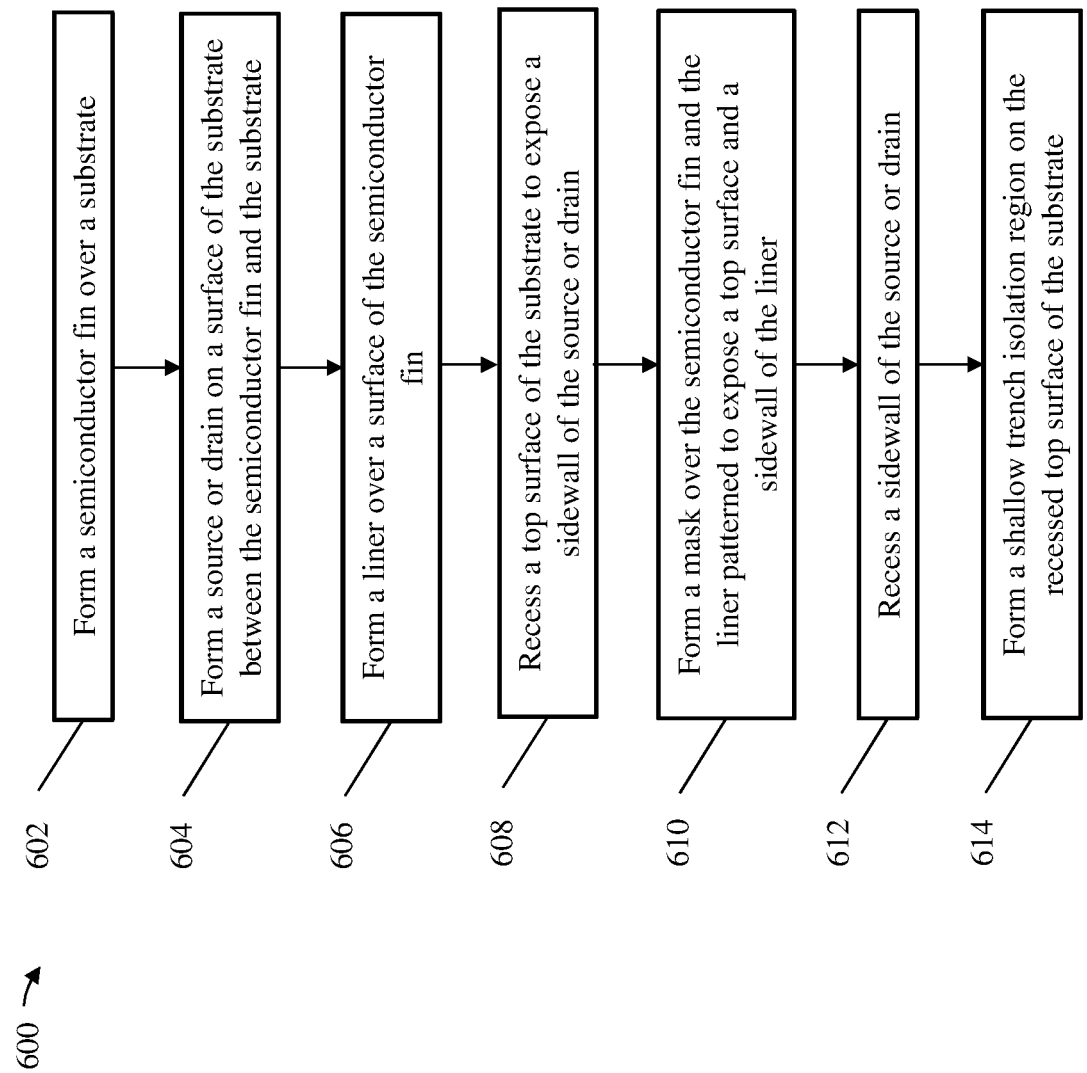
FIG. 6 depicts a flow diagram illustrating a method according to one or more embodiments of the invention.

FIG. 6 depicts a flow diagram 600 illustrating a method for forming a semiconductor device according to one or more embodiments of the invention. As shown at block 602, a semiconductor fin is formed over a substrate. At block 604, a source or drain is formed on a surface of the substrate. The source or drain can be formed between the semiconductor fin and the substrate. At block 606, a liner is formed over a surface of the semiconductor fin. The liner can be formed in a similar manner as the liner 108 discussed previously herein with respect to FIG. 1.

At block 608, a top surface of the substrate is recessed to expose a sidewall of the source or drain. In some embodiments of the invention, recessing the top surface of the substrate defines a first trench having a first width. At block 610, a mask is formed over the semiconductor fin and the liner. The mask can be patterned to expose a top surface and a sidewall of the liner.

At block 612, a sidewall of the source or drain is recessed. In some embodiments of the invention, recessing the sidewall of the source or drain includes exposing the sidewall of the source or drain to a wet etch selective to the liner. In some embodiments of the invention, recessing the sidewall of the source or drain defines a second trench having a second width greater than the first width. In some embodiments of the invention, a sidewall of the second trench is coplanar to a sidewall of the semiconductor fin. In some embodiments of the invention, the sidewall of the source or drain is recessed in a direction substantially perpendicular to a major surface of the substrate. In some embodiments of the invention, a sidewall of the substrate is recessed as well, either before, during, or after recessing the source or drain.

At block 614, a shallow trench isolation region is formed on the recessed top surface of the substrate. The shallow trench isolation region is adjacent to the recessed sidewall of the source or drain. In some embodiments of the invention, forming the shallow trench isolation region includes filling the second trench with a dielectric material.

Figure 7:
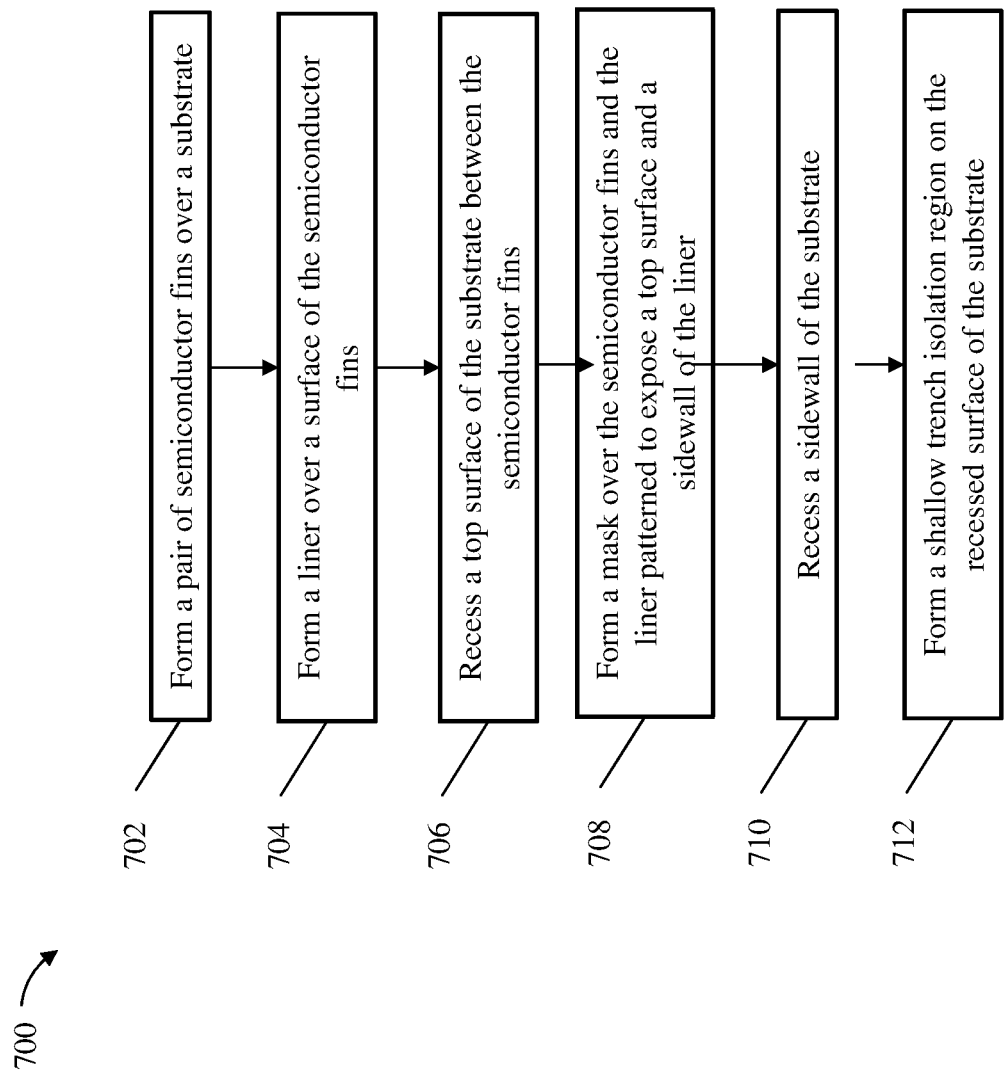
FIG. 7 depicts a flow diagram illustrating a method according to one or more embodiments of the invention.

FIG. 7 depicts a flow diagram 700 illustrating a method for forming a semiconductor device according to one or more embodiments of the invention. As shown at block 702, a pair of semiconductor fins is formed over a substrate. At block 704, a liner is formed over a surface of the semiconductor fins.

At block 706, a top surface of the substrate between the semiconductor fins is recessed. In some embodiments of the invention, recessing the top surface of the substrate defines a first trench having a first width. At block 708, a mask is formed over the semiconductor fins and the liner. The mask can be patterned to expose a top surface and a sidewall of the liner.

At block 710, a sidewall of the substrate is recessed. In some embodiments of the invention, recessing the sidewall of the substrate includes a wet etch selective to the liner. In some embodiments of the invention, recessing the sidewall of the substrate defines a second trench having a second width greater than the first width. In some embodiments of the invention, a sidewall of the second trench is coplanar to a sidewall of the semiconductor fin. In some embodiments of the invention, the sidewall of the substrate is laterally recessed.

At block 712, a shallow trench isolation region is formed on the recessed surface of the substrate. In some embodiments of the invention, forming the shallow trench isolation region includes filling the second trench with a dielectric material.

The method can further include forming a source or drain on a surface of the substrate. The source or drain can be positioned between the semiconductor fins and the substrate. The source or drain can be formed prior to, during, or after forming the semiconductor fins. In some embodiments of the invention, sidewalls of the source or drain are recessed to form the second trench.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (e.g., rotated 90 degrees or at other orientations), and the spatially relative descriptors used herein should be interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer or a conformal deposition) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention of the invention, epitaxial growth and/or deposition processes can be selective to forming on semiconductor surface, and may or may not deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming a semiconductor device, the method comprising:
   forming a semiconductor fin over a substrate;
   forming a source or drain (S/D) region on a surface of the substrate, the S/D region positioned between the semiconductor fin and the substrate;
   forming a liner over a surface of the semiconductor fin;
   recessing a top surface of the substrate to expose a sidewall of the S/D region;
   forming a mask over the semiconductor fin and the liner, the mask patterned to expose a top surface and a sidewall of the liner;
   recessing a sidewall of the S/D region; and
   forming a shallow trench isolation region on the recessed top surface of the substrate, the shallow trench isolation region adjacent to the recessed sidewall of the S/D region.

2. The method of claim 1, wherein recessing the sidewall of the S/D region comprises a wet etch selective to the liner.

3. The method of claim 1, wherein recessing the top surface of the substrate defines a first trench having a first width.

4. The method of claim 3, wherein recessing the sidewall of the S/D region defines a second trench having a second width greater than the first width.

5. The method of claim 4, wherein a sidewall of the second trench is coplanar to a sidewall of the semiconductor fin.

6. The method of claim 4, wherein forming the shallow trench isolation region comprises filling the second trench with a dielectric material.

7. The method of claim 1, wherein the sidewall of the S/D region is recessed in a direction substantially perpendicular to a major surface of the substrate.

8. The method of claim 1 further comprising recessing a sidewall of the substrate.

9. A method for forming a semiconductor device, the method comprising:
    forming a pair of semiconductor fins over a substrate;
    forming a liner over a surface of the semiconductor fins;
    recessing a top surface of the substrate between the semiconductor fins;
    forming a mask over the semiconductor fins and the liner, the mask patterned to expose a top surface and a sidewall of the liner;
    recessing a sidewall of the substrate, wherein recessing the sidewall of the substrate comprises a wet etch selective to the liner; and
    forming a shallow trench isolation region on the recessed surface of the substrate.

10. The method of claim 9, wherein recessing the top surface of the substrate defines a first trench having a first width.

11. The method of claim 10, wherein recessing the sidewall of the substrate defines a second trench having a second width greater than the first width.

12. The method of claim 11, wherein a sidewall of the second trench is coplanar to a sidewall of the semiconductor fin.

13. The method of claim 11, wherein forming the shallow trench isolation region comprises filling the second trench with a dielectric material.

14. The method of claim 9, wherein the sidewall of the substrate is laterally recessed.

15. The method of claim 9 further comprising forming a source or drain (S/D) region on a surface of the substrate, the S/D region positioned between the semiconductor fins and the substrate.

16. The method of claim 15 further comprising recessing a sidewall of the S/D region.

* * * * *